(12) United States Patent
Voyer et al.

(10) Patent No.: US 12,191,784 B2
(45) Date of Patent: Jan. 7, 2025

(54) METHOD AND DEVICE FOR DETERMINING A POSITION OF A ROTOR OF A THREE-PHASE MOTOR

(71) Applicant: MITSUBISHI ELECTRIC CORPORATION, Tokyo (JP)

(72) Inventors: Nicolas Voyer, Rennes (FR); Guilherme Bueno Mariani, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 109 days.

(21) Appl. No.: 17/796,961

(22) PCT Filed: Dec. 11, 2020

(86) PCT No.: PCT/JP2020/047311
§ 371 (c)(1),
(2) Date: Aug. 2, 2022

(87) PCT Pub. No.: WO2021/181806
PCT Pub. Date: Sep. 16, 2021

(65) Prior Publication Data
US 2023/0066163 A1   Mar. 2, 2023

(30) Foreign Application Priority Data
Mar. 11, 2020 (EP) .................................. 20162285

(51) Int. Cl.
*H02P 21/18* (2016.01)
*G01R 27/26* (2006.01)
(Continued)

(52) U.S. Cl.
CPC .......... *H02P 21/18* (2016.02); *G01R 27/2611* (2013.01); *H02P 21/0003* (2013.01); *H02P 21/22* (2016.02)

(58) Field of Classification Search
CPC ...... H02P 21/18; H02P 21/0003; H02P 21/22; H02P 2203/11; H02P 21/32; H02P 21/13; G01R 27/2611
See application file for complete search history.

(56) References Cited

U.S. PATENT DOCUMENTS

| | | | | |
|---|---|---|---|---|
| 2009/0079374 A1* | 3/2009 | De Four | ................ | H02P 6/182 |
| | | | | 318/400.34 |
| 2010/0194319 A1 | 8/2010 | Ito et al. | | |

(Continued)

FOREIGN PATENT DOCUMENTS

| | | |
|---|---|---|
| EP | 1 401 093 A2 | 3/2004 |
| EP | 2 515 431 A2 | 10/2012 |

(Continued)

OTHER PUBLICATIONS

Japanese Office Action for Japanese Application No. 2022-558827, dated Apr. 4, 2023, with an English translation.

(Continued)

*Primary Examiner* — Alvaro E Fortich
(74) *Attorney, Agent, or Firm* — Birch, Stewart, Kolasch & Birch, LLP

(57) ABSTRACT

The present invention concerns a method and a device for determining a position of a rotor of a three-phase motor using a FOC system. The invention: —determines, by a proportional-integral controller, a first control voltage vector at a first instant, —transforms the first control voltage vector using an inverse Park transform, —sums the transformed first control voltage vector to a regular polygonal voltage pattern applied during a given duration, —performs a PWM from the sum of the transformed first control voltage vector and the regular polygonal voltage pattern, —controls the motor with the pulse-width modulation, —measures the current at each phase of the motor, —estimates the position of the rotor from the measured currents and from the regular polygonal voltage pattern, —determines, at a second instant, (Continued)

a second control voltage vector from the measured currents and from the estimated position.

11 Claims, 7 Drawing Sheets

(51) Int. Cl.
  *H02P 21/00* (2016.01)
  *H02P 21/22* (2016.01)

(56) References Cited

U.S. PATENT DOCUMENTS

2014/0333241 A1* 11/2014 Zhao .................. H02P 27/08
  318/400.02
2019/0063494 A1* 2/2019 Kozaki .................. H02K 7/09

FOREIGN PATENT DOCUMENTS

| JP | 2007-129844 A | 5/2007 |
| JP | 2012-182859 A | 8/2012 |
| JP | 5089306 B2 | 11/2012 |
| JP | 2015-89322 A | 5/2015 |

OTHER PUBLICATIONS

International Search Report (PCT/ISA/210) issued in PCT/JP2020/047311, dated Mar. 12, 2021.
Written Opinion of the International Searching Authority (PCT/ISA/237) issued in PCT/JP2020/047311, dated Mar. 12, 2021.

* cited by examiner

METHOD AND DEVICE FOR DETERMINING A POSITION OF A ROTOR OF A THREE-PHASE MOTOR

TECHNICAL FIELD

The present invention relates generally to a device and a method for determining the position of a rotor of a three-phase motor.

BACKGROUND ART

Sensor less control is needed in motor applications for which precise rotor position is needed, and when rotary encoder is not a viable solution, e.g. in low-cost and/or dusty environment. It basically consists in estimating the rotor position by an analysis of electrical waveforms (voltages, currents) available at machine connectors.

Some algorithms have been proposed in literature to address this problem. A first class of algorithms are based on observation at a sufficient speed of differences in Back Electromotive Force (BEMF) produced in q and d axes. The BEMF may differ due to presence of permanent magnets and/or due to different inductances in d and q axes (in salient pole machines).

At low speeds or standstill, BEMF tends to hide behind the measurement noise floor, other methods must be used such as dI/dt based methods. For salient pole machines, difference in differential inductances enables to estimate the position of the machine from comparison of applied voltage steps and current derivatives. Also for these methods, the measurement noise floor limits the detection ability to cases with sufficient current ripple. At standstill, voltage pulses get very narrow and hard to assert with high precision, e.g. due to switching transients, and current ripple also tends to hide below the measurement noise. High-frequency, high resolution analog-to-digital converters (ADC) are needed for measurements.

High frequency voltage injection can be used to produce arbitrary current ripple shapes and increase the signal-to-noise ratio for the estimation. The paper of M. Laumann, C Weiner, and R. Kennel entitled "Arbitrary injection based sensorless control with a defined high frequency current ripple and reduced current and sound level harmonics," published in SLED 2017, discloses a method that enables the determination of machine position by injecting high frequency voltage for any injected voltage shape. In practice, high frequency injection is producing audible noise, and deserves special care for either rejecting the produced acoustic noise away from audible frequency band or for reducing/spreading the levels of produced harmonics resulting from injection.

Most methods rely on availability of inductances or differential inductance values prior to the estimation. This is not so easy to implement in practice with great accuracy, as inductances significantly vary with currents (saturation and/or cross saturation) and temperature profile of the core. Furthermore, the estimation of inductances in the torque producing regions typically requires some specific instrumentation (locked rotor tests, or rotational tests with test load and rotary encoder) to avoid uncontrolled (and potentially dangerous) operation of the machine.

SUMMARY OF INVENTION

The present invention aims to provide a method and a device for determining a precise rotor position without requiring any inductance value knowledge.

To that end, the present invention concerns a method for determining a position of a rotor of a three-phase motor using a field-oriented control system, characterized in that the method comprises the steps of:
 determining, by a proportional-integral controller, a first control voltage vector at a first instant,
 transforming the first control voltage vector using an inverse Park transform,
 summing the transformed first control voltage vector to a regular polygonal voltage pattern, the regular polygonal voltage pattern being applied during a given duration,
 performing a pulse width modulation from the sum of the transformed first control voltage vector and the regular polygonal voltage pattern,
 controlling the motor with the pulse width modulation,
 measuring the current at each phase of the motor,
 estimating the position of the rotor from the measured currents and from the regular polygonal voltage pattern,
 determining, at a second instant, a second control voltage vector from the measured currents and from the estimated position, the time between first and second instants being upper than or equal to the given duration.

The present invention concerns also a device for determining a position of a rotor of a three-phase motor using a field-oriented control system, characterized in that the device comprises:
 means for determining, by a proportional-integral controller, a first control voltage vector at a first instant,
 means for transforming the first control voltage vector using an inverse Park transform,
 means for summing the transformed first control voltage vector to a regular polygonal voltage pattern, the regular polygonal voltage pattern being applied during a given duration,
 means for performing a pulse width modulation from the sum of the transformed first control voltage vector and the regular polygonal voltage pattern,
 means for controlling the motor with the pulse width modulation,
 means for measuring the current at each phase of the motor,
 means for estimating the position of the rotor from the measured currents and from the regular polygonal voltage pattern,
 means for determining, at a second instant, a second control voltage vector from the measured currents and from the estimated position, the time between first and second instants being upper than or equal to the given duration.

Thus, the regular polygonal voltage pattern can be used to estimate the rotor position of the motor from the measured currents and in absence of knowledge of motor inductances and saliency. The method can operate under normal operation of the motor, and the variations of first voltage vector do not interfere with the estimation. The method can estimate rotor position in any conditions of the motor (including standstill, low and high speed, and including high torque/current regions).

According to a particular feature, the pulse-width modulation is further performed from a carrier signal, the motor is controlled by the pulse-width modulation through an inverter and the currents are measured at the extremums of the carrier signal, the regular polygonal pattern is composed of plural consecutive subperiods, each sub period being equal to an integer number times half the period of the carrier signal, and starting at one extremum of the carrier signal.

Thus, the voltage applied to the motor terminals and averaged between successive current measurements precisely matches the sum of the transformed first control voltage vector and the regular polygonal voltage pattern. The currents measured response of the motor is not affected by crosstalk between voltage vectors composing the regular polygonal voltage pattern.

Moreover, as the subperiod duration gets minimised down to half the period of the carrier signal, the minor loops are small, leading to small iron losses and lower audible noise. The pattern duration is also small, so that time between first and second instants is also small: the reactivity of the controller to fast transients is improved.

According to a particular feature, the position of the rotor is estimated from a polygonal current response, which is built from a number of current measurements, equal to the number of subperiods plus one, and the difference between the first and last current measurements is used to modify the other current measurements in order to obtain the polygonal current response.

Thus, the polygonal current response is closed, and any drift of average current due to presence of ohmic losses and/or back electromotive force caused by rotation is precisely compensated. The modified polygonal current response reflects only HF current variations due to HF voltage injection. As a result, there is no cross-talk between normal operation of the machine and position estimation from the triangular modified current response. The estimation of position is more reliable.

According to a particular feature, the regular polygonal pattern is composed of at least three subperiods, the estimation of the position of the rotor from the measured currents and from the regular polygonal voltage pattern is performed using a number of coefficients that is equal to the number of subperiods and the coefficients are determined from the polygonal current response.

Thus, the coefficients can easily get determined from the triangular current response. As voltage injection causes the injection of high frequency equilateral flux, one can easily determine the position of the rotor from the observed coefficients.

According to a particular feature, the estimation of the position of the rotor from the measured currents and from the regular polygonal voltage pattern is performed from the polygonal current response that forms a constellation of points using a minimum mean square error method, in order to find a straight line passing through the gravity center of constellation points with an angle and having a minimal distance with the set of points in the constellation, the angle being the position of the rotor.

Thus, the estimation of the position can get estimated for any size of regular polygonal voltage pattern. The straight line reflects the direction of highest currents, i.e. the direction with lowest inductance. This inductance can be identified as the rotor axis offering the lowest inductance (typically, the d axis).

According to a particular feature, the method comprises further steps of:
estimating a first rotational speed of the rotor from the first estimated position of the rotor,
determining the periodicity of the control voltage vector from the first estimated rotational speed,
determining the periodicity of the regular polygonal voltage pattern from the periodicity of the control voltage vector.

Thus, the periodicity of injected regular polygonal voltage pattern is relaxed, reducing the level of noise at low speed. In contrast, at higher speeds, the injection is more frequent, enabling better monitoring of the variations of the rotor position. At high speeds, audible noise caused by injection is masked by other rotational sources of noise.

According to a particular feature, the method further comprises the steps of:
estimating inductance values of the motor from the measured currents and from the regular polygonal voltage pattern,
determining a value of a voltage that is used to generate the regular polygonal voltage pattern from the estimated inductance values.

Thus, the size of voltage pattern is controlled to limit the high frequency response of motor current to a minimum level. When the motor saturates, e.g. in presence of large traction current, smaller voltage injection is needed to get measurable current response. As a result, the size of minor magnetisation loops in the motor is limited, limiting also HF losses and the level of audible noise.

According to a particular feature, the method further comprises the step of:
transforming the second control voltage vector using an inverse Park transform,
performing a pulse width modulation from the transformed other control voltage vector,
controlling the motor with the pulse width modulation,
measuring the current at each phase of the motor,
estimating a second rotor position of the rotor according to the first estimated rotor position, first estimated rotor speed, and the periodicity of the control voltage vector,
determining a third control voltage pattern from the measured currents and from the estimated second rotor position.

Thus, the control can adjust finely the second voltage vector in absence of injection, in presence of a constant speed. The position and speed is estimated only at occurrence of pattern injection. In absence of injection, the position can be extrapolated. At low speeds, the PI controller can quickly react to sudden torque rise even when the injection pattern is intermittent.

According to a particular feature, the regular polygonal voltage pattern has a null average value (null average value including a zero average value) in a dq reference frame.

Thus, the phase-to-phase voltage applied to the motor terminals equals in average that of the first voltage vector. The dynamics of the motor control is not affected by the superposition of the regular voltage pattern. There is no interference between the PI controller and the injection loop used for determining the rotor position. As a result, the sensor less control method is very stable and robust.

According to a particular feature, one regular polygonal voltage pattern is summed for each phase and the regular polygonal voltage pattern is inverted or permuted at each determination of a control voltage vector.

Thus, the audible noise resulting from successive injection can be randomised. Any undesired non-linear effect in the motor drive gets equally spread over each motor terminal.

According to a particular feature, the method further comprises the step of memorizing the estimated inductance values.

BRIEF DESCRIPTION OF DRAWINGS

The characteristics of the invention will emerge more clearly from a reading of the following description of example embodiments, the said description being produced with reference to the accompanying drawings, among which.

DESCRIPTION OF EMBODIMENTS

Figure 1:
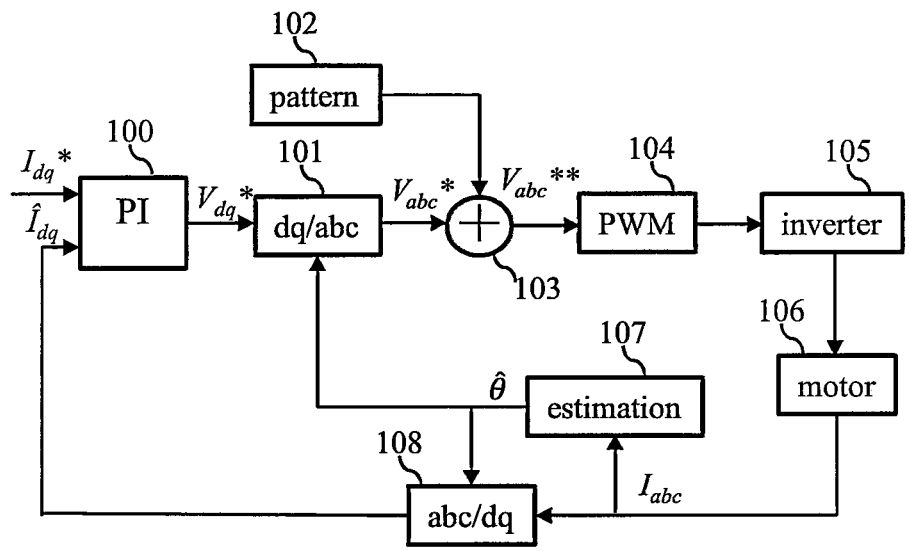
FIG. 1 represents an example of a Field-Oriented Control system in which the present invention is implemented.

FIG. 1 represents an example of a Field-Oriented Control system in which the present invention is implemented.

Field-Oriented Control (FOC) is a variable-frequency drive control method in which the stator currents of a three-phase AC electric motor are identified as two orthogonal components that can be visualized with a vector. In $\alpha\beta$ reference frame representative of the stator, the vector rotates around the origin in synchronism with the rotor. In dq reference frame representative of the rotor, the vector is stabilised around reference current levels using (PI) controller. Depending on application, current reference can be as example determined from torque reference, which can itself be determined from a speed controller.

Typically, proportional-integral (PI) controllers are used to keep the measured current components at their reference values.

The Pulse-Width modulation (PWM) of the variable-frequency drive defines the timings of inverter switching according to the stator voltage references that are the output of the PI current controllers.

FOC is used to control AC synchronous and induction motors.

It was originally developed for high-performance motor applications that are required to operate smoothly over a full speed range, generate full torque at zero speed, and have high dynamic performance including fast acceleration and deceleration.

The Field-Oriented Control system comprises a proportional-integral controller PI 100 that calculates the voltages $V_d^*$ and $V_q^*$ for the torque and flux at the desired speed required by the machine to reach the reference currents $I_d^*$ and $I_q^*$. The required voltages $V_d^*$ and $V_q^*$ are then transformed back to the voltages $V_a^*$, $V_b^*$ and $V_c^*$ using an inverse Park transform 101. A pattern generation module 102 provides three injection patterns that are respectively added to the voltages $V_a^*$, $V_b^*$ and $V_c^*$ by an adding module 103. The voltages $V_a^{}$, $V_b^{}$ and $V_c^{**}$ at the output of the adding module 103 are pulse-width modulated by a pulse-width modulation module PWM 104. The pulse-width modulated signals are then provided to inverter legs of a three-phase inverter 105 for regulating an amount of voltage from a DC voltage source not shown in FIG. 1 to be provided to each phase terminals of a motor 106.

The current $I_a$, $I_b$ and $I_c$ are measured at each phase terminal of the motor and provided to an estimation module 107 and to a Park transform module 108. The measurements of $I_a$, $I_b$ and are performed in a synchronous manner in respect of the PWMs signal. The measurements of $I_a$, $I_b$ and $I_c$ are performed at points $P_1$, $P_2$ and $P_3$ in FIG. 2. The outputs of the Park transform module 108 $\hat{I}_d$ and $\hat{I}_q$ are provided to the proportional-integral controller PI 100. The proportional-integral controller PI 100 compares the measured and reference currents and filters the difference using a weighted sum of proportional and integral terms of the observed difference.

It should be noted that the PI controller 100, the transformation modules 101 and 108, the estimation module 107 are activated at a given vector control frequency $f_{CTRL}$.

The estimation module 107 provides an estimate of the angle $\hat{\theta}$ of the rotor to the inverse Park transform 101 and to the Park transform module 108.

In FIG. 1, $I_{dq}^*$ stands for $I_d^*$ and $I_q^*$, $V_{dq}^*$ stands for $V_d^*$ and $V_q^*$, $V_{abc}^*$ stands for $V_a^*$, $V_b^*$ and $V_c^*$, $V_{abc}^{}$ stands for $V_a^{}$, $V_b^{}$ and $V_c^{}$, $I_{abc}$ stands for $I_c$, $I_a$, $I_b$ and $I_c$ and $\hat{I}_{dq}$ stands for $\hat{I}_d$ and $\hat{I}_q$.

Figure 2:
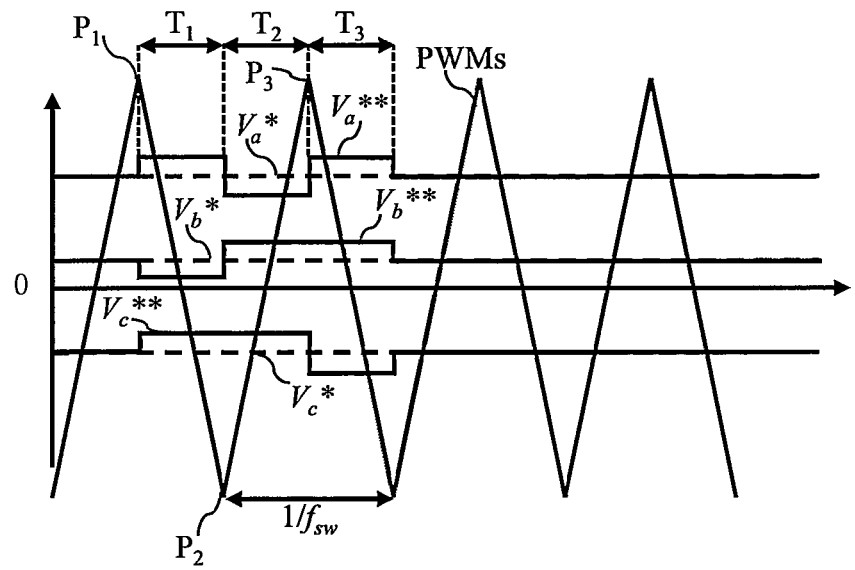
FIG. 2 represents an example of PWM signals with a triangular voltage injection according to the invention.

FIG. 2 represents an example of PWM related signals with a triangular voltage injection according to the invention.

Figure 3:
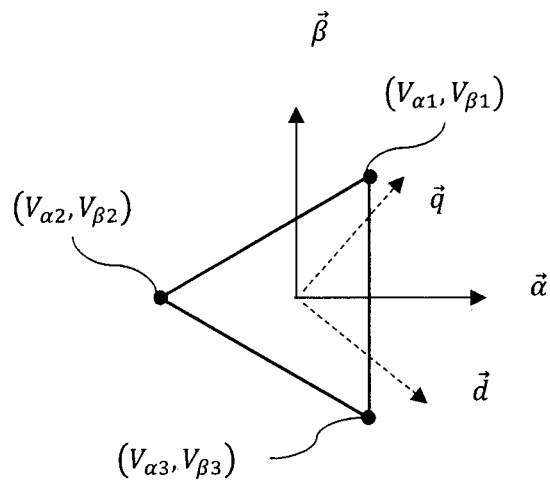
FIG. 3 represents the injected voltage pattern.

As seen in FIG. 2, the injection pattern, named also polygonal regular voltage pattern, is typically composed of 3 PWM subperiods $T_1$, $T_2$, $T_3$ of equal duration $T_c=\frac{1}{2}f_{sw}$ of a pulse width modulated signal PWMs provided by the pulse-width modulation module PWM 104. The voltages $V_a^*$, $V_b^*$ and $V_c^*$ issued by the PI controller 100 are assumed constant during the duration of the injection pattern ($T_1+T_2+T_3$). The voltage pattern varies across subperiods for example as follows. During $T_1$, the voltage $-V_o$ is added to $V_a^*$, the voltage $+V_o$ is added to $V_b^*$ and the voltage $+V_o$ is added to $V_c^*$. During $T_2$, the voltage $+V_o$ is added to $V_a^*$, the voltage $-V_o$ is added to $V_b^*$ and the voltage $+V_o$ is added to $V_c^*$. During $T_3$, the voltage $+V_o$ is added to $V_a^*$, the voltage $+V_o$ is added to $V_b^*$ and the voltage $-V_o$ is added to $V_c^*$. The offset voltage $V_o$ is chosen to provide sufficient current ripple in order to avoid noise and/or interference. The injected HF voltage pattern forms an equilateral triangle in frame as shown in FIG. 3.

It has to be noted here that the regular polygonal voltage patterns are inverted or permuted at each determination of a control voltage vector.

According to invention, the injection pattern can be of any size, but is always composed of N subperiods T1, T2, ..., TN of equal duration, e.g. Tc=K/2$f_{sw}$, where K is an integer. The sum of voltage pattern across subperiods is identical across each phase, so that the phase-to-phase voltage averaged across the duration of the injection pattern is unmodified by the injection pattern.

The PWM controller 104 compares the reference voltage levels $V_a^{}$, $V_b^{}$, $V_c^{}$ with the carrier signal PWMs and produces control signals to the inverter 105**.

The carrier signal PWMs is periodic, with a frequency identical to the switching frequency $f_{sw}$ of inverter legs. The comparison is made at much higher frequency rate ($f_{PWM}$, few MHz) to keep good controllability of inverter voltage.

According to the invention, it should be noted that the switching frequency is not equal to the vector control frequency. Especially, the reference voltage levels $V_a^*$, $V_b^*$ and $V_c$ are constant over the total duration of the injected pattern. Thus, the control frequency is smaller than the switching frequency (N·$f_{CTRL}$<2·$f_{sw}$).

As example, the carrier signal PWMs is triangular, and the inverter 105 connects in parallel a voltage DC source and one inverter leg per phase. When the reference voltage of one phase gets higher than the carrier signal, the PWM controller 104 switches the corresponding inverter leg into its high state, connecting the phase terminal of the machine to the upper side of the DC voltage source. Reversely, when the reference voltage of one phase gets lower than the carrier signal, the PWM controller switches the corresponding inverter leg into its low state, connecting the phase terminal of the machine to the lower side of the DC voltage source.

The addition of a voltage vector to the reference voltages $V_a^*$, $V_b^*$, $V_c^*$, causes the modification of position and duration of inverter states, so as to effectively impose the desired voltage levels, averaged during the period of the carrier signal PWMs.

Figure 4:
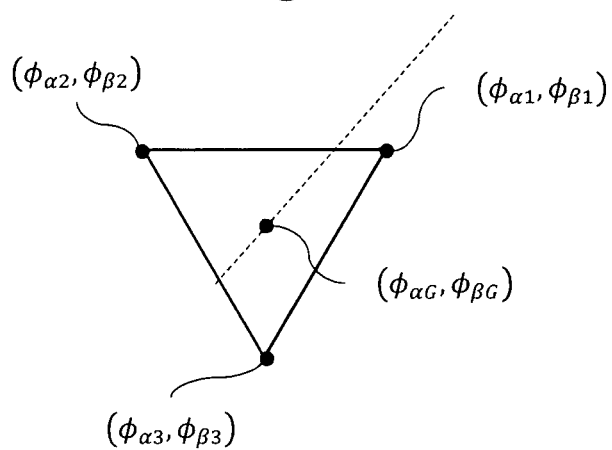
FIG. 4 represents the differential flux response.
Figure 5:
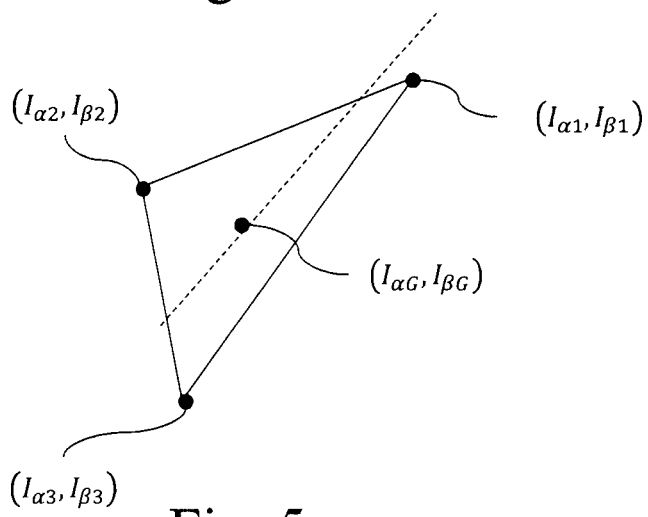
FIG. 5 represents the differential current response.

FIGS. 3, 4, 5 represent triangular flux injection in a frame.

The FIG. 3 represents the injected voltage pattern, the FIG. 4 represents the differential flux response and the FIG. 5 represents the differential current response.

The fundamental equation of the system is given as $$V_{abc} = RI_{abc} + \frac{d\phi_{abc}}{dt} \quad (1)$$

In dq frame, this equation becomes $$V_{dq} = RI_{dq} + w\begin{bmatrix} 0 & -1 \\ 1 & 0 \end{bmatrix}\phi_{dq} + \frac{d\phi_{dq}}{dt} \quad (2)$$

For salient pole machines, the flux is expressed as $$\phi_{dq} = \begin{bmatrix} L_d & 0 \\ 0 & L_q \end{bmatrix} I_{dq} + \phi_{PM} \quad (3)$$

In absence of permanent magnets, or assuming that the flux of permanent magnets is constant, $$\frac{d\phi_{PM}}{dt} = 0,$$

we get $$\frac{d\phi_{dq}}{dt} = \begin{bmatrix} L_d & 0 \\ 0 & L_q \end{bmatrix}\frac{dI_{dq}}{dt} + \begin{bmatrix} \frac{dL_d}{dt} & 0 \\ 0 & \frac{dL_q}{dt} \end{bmatrix} I_{dq} \quad (4)$$

from which yields the fundamental relation between HF flux and current terms:

$$\frac{d\phi_{dq}}{dt} = \begin{bmatrix} L_d' & M_{qd} \\ M_{dq} & L_q' \end{bmatrix}\frac{dI_{dq}}{dt} \quad (5)$$

where $L_d'$ and $L_q'$ are differential inductances, and $M_{qd}$, $M_{dq}$ are coupling inductances given by (6) and (7):

$$L_d' = L_d + \frac{dL_d}{dI_d}I_d;\ L_q' = L_q + \frac{dL_q}{dI_q}I_q; \quad (6)$$

$$M_{qd} = \frac{dL_d}{dI_q}I_d;\ M_{dq} = \frac{dL_q}{dI_d}I_q \quad (7)$$

Using the notation C=cos(θ), S=sin(θ), where θ is the direction of the d-axis of the rotor in αβ frame, the relation becomes (5)

$$\frac{d\phi_{\alpha\beta}}{dt} = \begin{bmatrix} C & S \\ -S & C \end{bmatrix}\begin{bmatrix} L_d' & M_{qd} \\ M_{dq} & L_q' \end{bmatrix}\begin{bmatrix} C & -S \\ S & C \end{bmatrix}\frac{dI_{\alpha\beta}}{dt} \quad (8)$$

Eventually, (8) rewrites as (9), which is the fundamental relation linking variations of current with variations of flux in αβ frame.

$$\frac{dI_{\alpha\beta}}{dt} = \begin{bmatrix} B-\Delta & A+X_2 \\ A+X_1 & D+\Delta \end{bmatrix}\frac{d\phi_{\alpha\beta}}{dt} \quad (9)$$

where A, B, D, $X_1$, $X_2$ have the following expressions:

$$A = CS\left(\frac{1}{L_d'} - \frac{1}{L_q'}\right), \quad (10)$$

$$B = \frac{C^2}{L_d'} + \frac{S^2}{L_q'},$$

$$D = \frac{S^2}{L_d'} + \frac{C^2}{L_q'},$$

$$X_1 = \frac{S^2 M_{qd} - C^2 M_{dq}}{L_d' L_q' - M_{qd}M_{dq}}, \quad (11)$$

$$X_2 = \frac{S^2 M_{dq} - C^2 M_{qd}}{L_d' L_q' - M_{qd}M_{dq}},$$

$$\Delta = -CS\frac{M_{qd} + M_{dq}}{L_d' L_q' - M_{qd}M_{dq}}$$

From (10), a direct resolution of unknowns θ, $L_d'$, $L_q'$ can be reached upon observation of parameters A, B, D:

$$\tan(2\theta) = \frac{2A}{B-D} \tag{12}$$

$$L'_d = \frac{2}{D+B+\frac{2A}{\sin(2\theta)}} \tag{13}$$

$$L'_q = \frac{2}{D+B-\frac{2A}{\sin(2\theta)}} \tag{14}$$

The problem of direct estimation of position and of differential inductances therefore consists in identifying the parameters A, B, D from the observed triangular current response.

At standstill, when the machine has zero speed, zero acceleration, the reference voltage $V_a^*$, $V_b^*$, $V_c^*$ from PI controller 100 precisely compensates for the ohmic losses. The flux evolves in αβ frame between 3 flux points $\phi_{\alpha\beta_1}$, $\phi_{\alpha\beta_2}$, $\phi_{\alpha\beta_3}$, as shown in FIG. 4, which can be determined by time integration of the injected voltage pattern.

$$\begin{cases} \overrightarrow{\phi_{\alpha\beta_1}} = \overrightarrow{\phi_G} + \frac{V_o T_c}{\sqrt{3}}\begin{bmatrix}\sqrt{3}\\1\end{bmatrix} \\ \overrightarrow{\phi_{\alpha\beta_2}} = \overrightarrow{\phi_G} + \frac{V_o T_c}{\sqrt{3}}\begin{bmatrix}-\sqrt{3}\\1\end{bmatrix} \\ \overrightarrow{\phi_{\alpha\beta_3}} = \overrightarrow{\phi_G} + \frac{V_o T_c}{\sqrt{3}}\begin{bmatrix}0\\-2\end{bmatrix} \end{cases} \tag{15}$$

where $\overrightarrow{\phi_G} = (\overrightarrow{\phi_{\alpha\beta_1}} + \overrightarrow{\phi_{\alpha\beta_2}} + \overrightarrow{\phi_{\alpha\beta_3}})/3$ is the gravity point of the constellation of flux points. Because of the structure of applied voltage pattern (rotation of 120° and equal duration of subperiods), extreme flux points together form an equilateral triangle in αβ reference frame.

From (9), we derive that currents necessarily evolve in αβ frame between 3 current points $I_{\alpha\beta_1}$, $I_{\alpha\beta_2}$, $I_{\alpha\beta_3}$ as shown in FIG. 5.

$$\begin{cases} \overrightarrow{I_{\alpha\beta_1}} = \overrightarrow{I_G} + \frac{V_o T_c}{\sqrt{3}}\begin{bmatrix}(B-\Delta)\sqrt{3}+A+X_2\\\sqrt{3}(A+X_1)+D+\Delta\end{bmatrix} \\ \overrightarrow{I_{\alpha\beta_1}} = \overrightarrow{I_G} + \frac{V_o T_c}{\sqrt{3}}\begin{bmatrix}-(B-\Delta)\sqrt{3}+A+X_2\\-\sqrt{3}(A+X_1)+D+\Delta\end{bmatrix} \\ \overrightarrow{I_{\alpha\beta_1}} = \overrightarrow{I_G} + \frac{V_o T_c}{\sqrt{3}}\begin{bmatrix}-2(A+X_2)\\-2(D+\Delta)\end{bmatrix} \end{cases} \tag{16}$$

where $\overrightarrow{I_G} = (\overrightarrow{I_{\alpha\beta_1}} + \overrightarrow{I_{\alpha\beta_2}} + \overrightarrow{I_{\alpha\beta_3}})/3$ is the gravity point of the constellation of extreme current points.

Assuming current sampling at the edges or extremums of PWMs signal carrier i.e. at points $P_1$, $P_2$ and $P_3$ of FIG. 2, the current measurements are operated away from switching events and are not affected by associated ringing. At these sampling times, all motor legs are always connected to the same side of DC bus, and measured currents can be regarded as positioned at extreme points $I_{\alpha\beta_1}$, $I_{\alpha\beta_2}$, $I_{\alpha\beta_3}$.

The invention also applies when durations of subperiods are equal to an integer number K of half switching cycles, with a sampling frequency further reduced to $2f_{sw}/K$, and sampling timings still located at the edges of PWM signal carrier.

Irrespective of inductance levels, the triangle formed by extreme points $I_{\alpha\beta_1}$, $I_{\alpha\beta_2}$, $I_{\alpha\beta_3}$ is naturally elongated in the direction of the q axis for machines exhibiting some saliency ratio $$\frac{L_d}{L_q} > 1.$$

Under rotation, the PI controller 100 outputs a voltage reference that compensates for ohmic losses and for the back electromotive force (BEMF) of the motor 106 causing the average flux to turn in αβ frame synchronously with the rotor with a given speed, which can be assumed constant over the duration of the injection pattern. The added voltage pattern produces HF variations of flux, superposed to the average rotating flux, and the HF variations of flux keep following equation (15) yet with a gravity center sliding with time.

From equation (9), we can see that the current response will follow the same behavior: HF variations according to equation (16), with a gravity center also sliding in time. This causes the constellation of points of current to no longer follow a regular structure, as it will be disclosed in FIGS. 6, 7.

Figure 6:
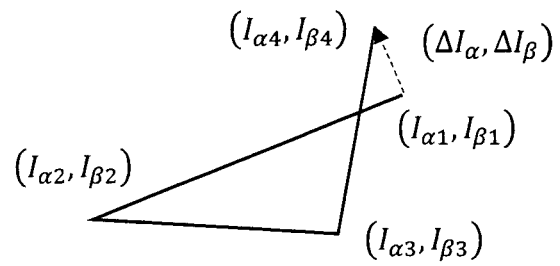
FIG. 6 represents the constellation of extreme points of current during rotation of the motor.

FIG. 6 represents the constellation of extreme points of current during rotation of the motor.

Figure 7:
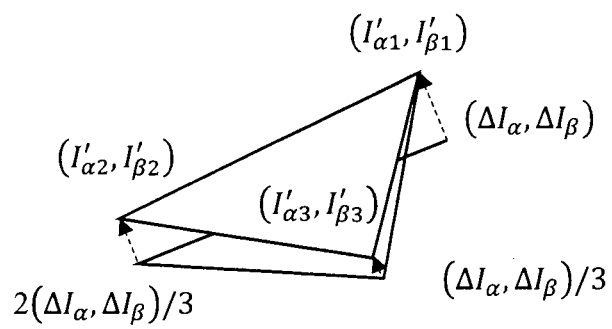
FIG. 7 represents the constellation of extreme points of current during the rotation of the motor after a compensation is applied.

FIG. 7 represents the constellation of extreme points of current during the rotation of the motor after a compensation is applied.

Once having completed a full triangular turn, the current $I_{\alpha\beta_4}$ measured at the end of injection is no longer aligned with the current $I_{\alpha\beta_1}$ measured just before the injection of triangular pattern, due to the rotational condition.

Equations (16) with constant (not gliding) gravity point can be maintained when applied to modified current levels $I_{\alpha\beta_1}'$, $I_{\alpha\beta_2}'$, $I_{\alpha\beta_3}'$ which are postprocessed according to (17) to compensate for the misalignment between measured currents $I_{\alpha\beta_1}$ and $I_{\alpha\beta_4}$ over one injection pattern cycle:

$$\begin{cases} \overrightarrow{I'_{\alpha\beta_1}} = \overrightarrow{I_{\alpha\beta_4}} \\ \overrightarrow{I'_{\alpha\beta_2}} = \overrightarrow{I_{\alpha\beta_2}} + 2(\overrightarrow{I_{\alpha\beta_4}} - \overrightarrow{I_{\alpha\beta_1}})/3 \\ \overrightarrow{I'_{\alpha\beta_3}} = \overrightarrow{I_{\alpha\beta_3}}(\overrightarrow{I_{\alpha\beta_4}} - \overrightarrow{I_{\alpha\beta_1}})/3 \end{cases} \tag{17}$$

It should be noted that the modification of current levels which suppresses the gliding of gravity center can equally be applied to non triangular patterns, i.e. any polygonal regular patterns.

Figure 8:
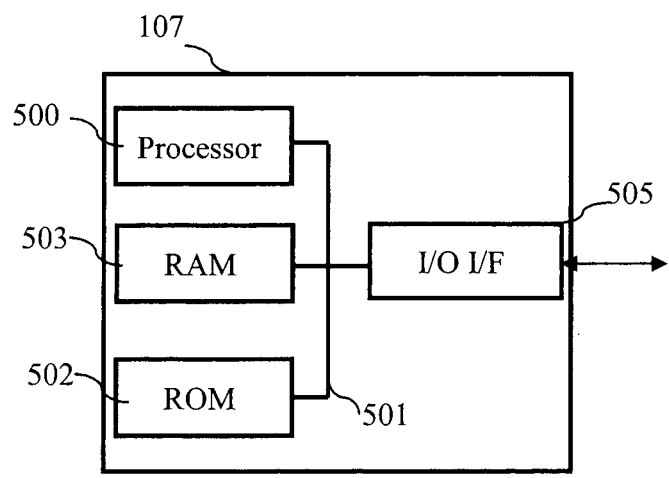
FIG. 8 represents an architecture of the estimation module that estimates the position of a rotor of a motor.

FIG. 8 represents an architecture of the estimation module that estimates the position of a rotor of a motor.

The estimation module 107 has, for example, an architecture based on components connected together by a bus 501 and a processor 500 controlled by a program.

The bus 501 links the processor 500 to a read only memory ROM 502, a random access memory RAM 503, and an input output I/O interface I/F 505.

The input output interface I/F 505 receives the currents measurements Ia, Ib and Ic and provides the angle $\hat{\theta}$ of the rotor to the inverse Park transform 101 and to the Park transform module 108.

Figure 10:
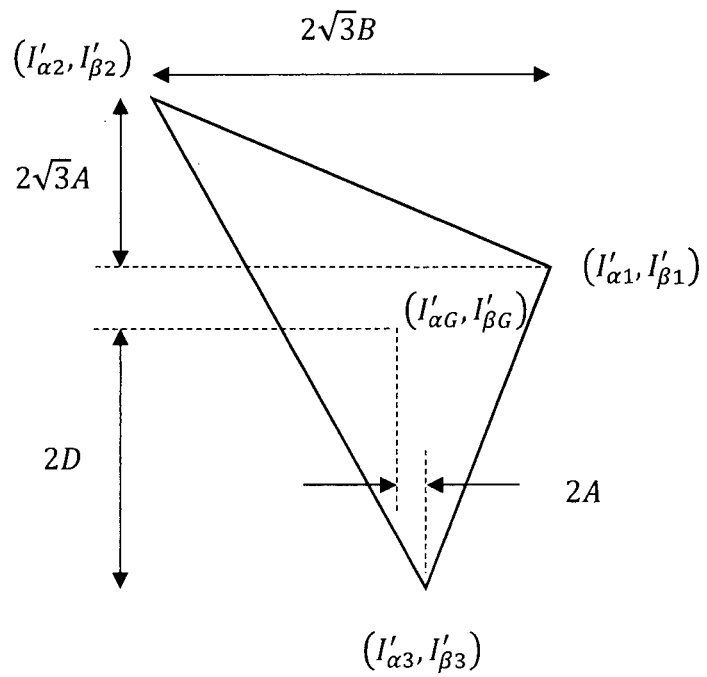
FIG. 10 represents measurable geometric relation in a triangular current response.

The memory 503 contains registers intended to receive variables and the instructions of the program related to the algorithm disclosed in FIG. 6 or 8 or 10.

The read-only memory, or possibly a flash memory 502, contains instructions of the program related to the algorithm disclosed in FIG. 6 or 8 or 10.

When the estimation module 107 is powered on, the instructions stored in the memory 503 are transferred to the random access memory 503.

The estimation module 107 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the estimation module 107 includes circuitry enabling the estimation module 107 to perform the program.

Figure 9:
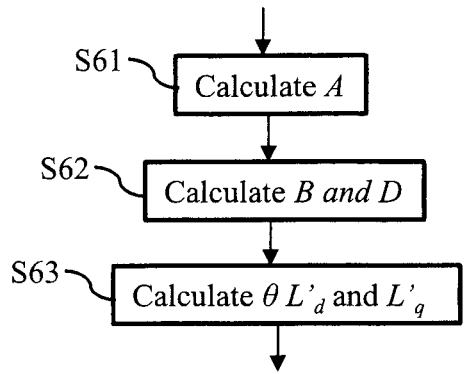
FIG. 9 represents a first example of an algorithm for estimating the position of a rotor of a motor.

FIG. 9 represents a first example of an algorithm for estimating the position of a rotor of a motor.

Neglecting the effect of coupling inductances $M_{qd}$, $M_{dq} \cong 0$, the fundamental equation (9) becomes $$\frac{dI_{\alpha\beta}}{dt} = \begin{bmatrix} B & A \\ A & D \end{bmatrix} \frac{d\phi_{\alpha\beta}}{dt} \quad (18)$$

As seen in FIG. 7, A, B, D parameters are then related to measured current vectors by (19).

$$\begin{cases} \vec{I_{\alpha\beta_1}} = \vec{I_G} + \frac{V_o T_c}{\sqrt{3}} \begin{bmatrix} B\sqrt{3} + A \\ \sqrt{3}A + D \end{bmatrix} \\ \vec{I_{\alpha\beta_2}} = \vec{I_G} + \frac{V_o T_c}{\sqrt{3}} \begin{bmatrix} -B\sqrt{3} + A \\ -\sqrt{3}A + D \end{bmatrix} \\ \vec{I_{\alpha\beta_3}} = \vec{I_G} + \frac{V_o T_c}{\sqrt{3}} \begin{bmatrix} -2A \\ -2D \end{bmatrix} \end{cases} \quad (19)$$

FIG. 10 represents measurable geometric relation in a triangular current response.

More precisely, the geometrical relations are shown by omitting a scale factor of $$\frac{V_o T_c}{\sqrt{3}}.$$

In absence of noise, we observe that A can be obtained by two independent calculation paths:

$$A = \frac{I_{\beta_1} - I_{\beta_2}}{4V_o T} = \frac{(I_{\alpha_G} - I_{\alpha_3})\sqrt{3}}{4V_o T} \quad (20)$$

At step S61, the estimation module 107 determines A using the formula noted 20.

At step S62, the estimation module 107 determines B and D using the following equation system:

$$\begin{cases} A = \frac{I_{\beta_1} - I_{\beta_2} + (I_{\alpha_G} - I_{\alpha_3})\sqrt{3}}{4V_o T_c} \\ B = \frac{I_{\alpha_1} - I_{\alpha_2}}{2V_o T_c} \\ D = \frac{(I_{\beta_G} - I_{\beta_3})\sqrt{3}}{2V_o T_c} \end{cases} \quad (21)$$

Thus, upon observation of triangular current response and neglecting effect of coupling inductances, the estimation module 107 can derive coefficients (A, B, D) from (19), and ultimately determine at step S63 position θ and differential inductances using the following formulas:

$$\tan(2\theta) = \frac{2A}{B - D} \quad (12)$$

$$L'_d = \frac{2}{D + B + \frac{2A}{\sin(2\theta)}}$$

$$L'_q = \frac{2}{D + B - \frac{2A}{\sin(2\theta)}}$$

The estimated inductance values may be memorized for example in a look up table.

Figure 11:
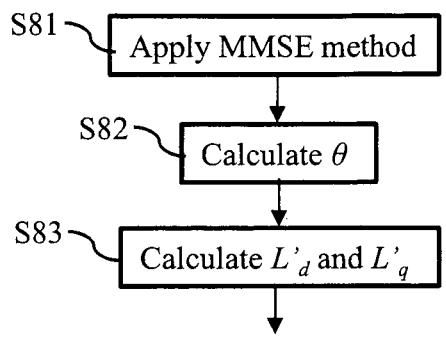
FIG. 11 represents a second example of an algorithm for estimating the position of a rotor of a motor.

FIG. 11 represents a second example of an algorithm for estimating the position of a rotor of a motor.

The effect of saliency typically causes the current to respond to a circular flux excitation with an elliptic shape. In absence of coupling inductances, the large axis of the elliptic shape can be considered aligned with q axis.

A linear regression may be applied for the direct detection of q axis from measured current response to injected equilateral flux.

At step S81, the estimation module 107 applies a Minimum Means Square Error method.

In a particular example, the injection patterns is triangular. Let us consider the constellation of three summits ($x_k$, $y_k$) of current response, expressed relatively to the gravity center of that constellation.

$$\begin{cases} x_k = I_{k\alpha} - I_{G\alpha} \\ y_k = I_{k\beta} - I_{G\beta} \end{cases} \quad (31)$$

Figure 12:
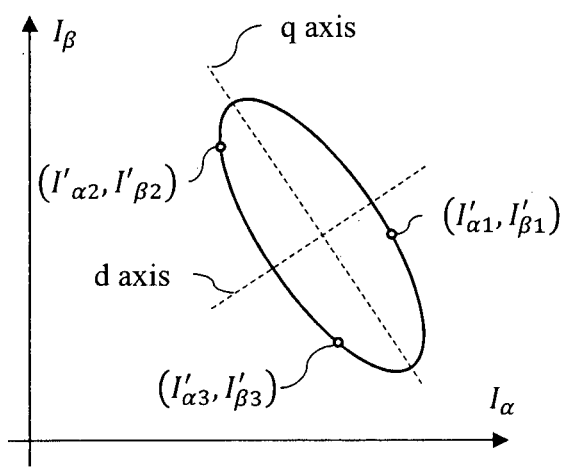
FIG. 12 represents an identification of q axis by a linear regression method.
Figure 13:
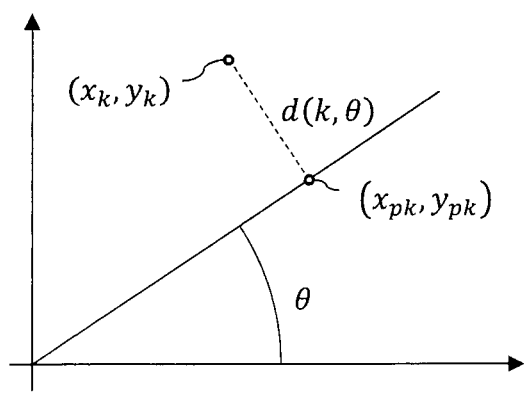
FIG. 13 represents the distances between constellation points and q axis.

As seen in FIGS. 12-13, the Minimum Mean Square Error (MMSE) method consists in finding the straight line passing through the gravity center with an angle θ with ox axis, the straight line having a minimal distance D with the set of points in the constellation.

FIG. 12 represents an identification of q axis by a linear regression method and FIG. 13 represents the distances between constellation points and q axis.

If constellation points are projected on the straight line perpendicularly to that line, the projected points ($x_{pk}$, $y_{pk}$) must verify the equation system:

$$\begin{cases} (x_k - x_{pk}) + (y_k - y_{pk}) \cdot a = 0 \\ ax_{pk} = y_{pk} \end{cases} \quad (32)$$

where $a = \tan(\theta_q)$. This system solves as $$\begin{cases} x_{pk} = \frac{x_k + ay_k}{1 + a^2} \\ y_{pk} = \frac{ax_k + a^2 y_k}{1 + a^2} \end{cases} \quad (33)$$

The square distance of a constellation point to the straight line is then given as:

$$d^2(k, \theta) = (x_k - x_{pk})^2 + (y_k - y_{pk})^2 = \frac{(y_k - ax_k)^2}{1 + a^2} \quad (34)$$

The minimum total square distance of straight line to the constellation points must verify:

$$\frac{dD^2}{da} = \sum_k d_k^2 = 0 \Leftrightarrow \frac{d}{da} \sum_k \frac{(y_k - ax_k)^2}{1 + a^2} = 0 \quad (35)$$

leading to a second order polynomial of term a.

$$a^2 \Sigma_k x_k y_k + a(\Sigma_k x_k^2 - \Sigma_k y_k^2) - \Sigma_k x_k y_k = 0 \quad (36)$$

The solution is then given as:

$$a = \tan(\theta_q) = \frac{-\chi \pm \sqrt{\chi^2 + 4}}{2} \quad (37)$$

$$\chi = \frac{\sum_k x_k^2 - \sum_k y_k^2}{\sum_k x_k y_k} \quad (38)$$

where

Both solutions correspond to straight lines with minimum (q axis) and maximum distances to the constellation points. For positive sign of $\Sigma_k x_k y_k$, the derivative of the distance is first positive, negative, then positive, so that only the highest optimum is a local minimum. The solution choice is alternated for negative sign of $\Sigma_k x_k y_k$.

$$\begin{cases} \sum_k x_k y_k > 0 \Rightarrow \theta_q = a\tan\left(\frac{-\chi + \sqrt{\chi^2 + 4}}{2}\right) \\ \sum_k x_k y_k < 0 \Rightarrow \theta_q = a\tan\left(\frac{-\chi - \sqrt{\chi^2 + 4}}{2}\right) \\ \sum_k x_k y_k = 0, \begin{cases} \sum_k x_k^2 > \sum_k y_k^2 \Rightarrow \theta_q = 0 \\ \sum_k x_k^2 < \sum_k y_k^2 \Rightarrow \theta_q = \pi/2 \end{cases} \end{cases} \quad (39)$$

Thus, using equations (38) and (39), we can determine the angle $\theta_q$ of the q axis.

At step S82, the estimation module 107 determines the rotor angle as:

$$\theta = \theta_q - \pi/2 \quad (40)$$

Differential inductances can also get estimated from the distance $DI_q$, $DI_d$ of current constellation point to the optimal straight lines.

$$\begin{cases} DI_q = \sqrt{\frac{\sum_k y_x^2 - 2\sum_k x_k y_k a + \sum_k x_k^2 a^2}{1 + a^2}} \\ DI_d = \sqrt{\frac{\sum_k y_k^2 + 2\sum_k x_k y_k/a + \sum_k x_k^2/a^2}{1 + 1/a^2}} \end{cases} \quad (41)$$

For equilateral flux triangles formulated by equation (15), the distance of flux constellation points to any straight line can be reduced to a constant, whatever the director coefficient b of the straight line:

$$D\phi_b = \frac{V_o T_c}{\sqrt{3}} \sqrt{\frac{(1 + b\sqrt{3})^2 + (1 - b\sqrt{3})^2 + (-2)^2}{1 + b^2}} = V_o T_c \sqrt{2} \quad (42)$$

At step S83, the estimation module 107 determines inductances estimated as:

$$\begin{cases} L'_d = \frac{D\phi_d}{DI_d} \\ L'_q = \frac{D\phi_q}{DI_q} \end{cases} \quad (43)$$

It should be noted that formulas (32) to (41) are equally applicable for non-triangular constellations, i.e. for polygonal/circular voltage injection patterns.

The estimated inductance values may be memorized for example in a look up table.

Figure 14:
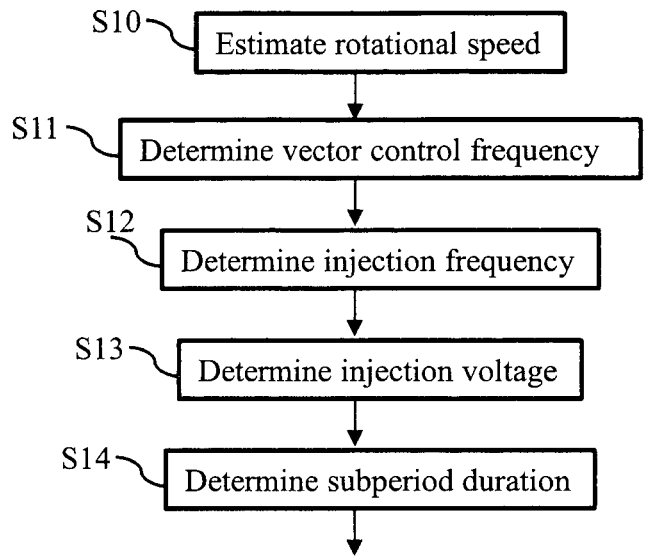
FIG. 14 represents an example of an algorithm that may executed by the position evaluation module after the execution of the algorithm disclosed in FIG. 9 or 11.

FIG. 14 represents an example of an algorithm that may executed by the position evaluation module after the execution of the algorithm disclosed in FIG. 9 or 11.

At step S10, the estimation module 107 estimates the rotational speed of the rotor from estimated position. The estimation module 107 estimates the rotational speed as $$\omega_e = \frac{d\theta}{dt}.$$

At step S11, the estimation module 107 determines the vector control frequency $f_{CTRL}$ from the estimated speed. The vector control frequency is the frequency at which operates the proportional-integral controller PI 100, the inverse Park transform 101, the estimation module 107 and the Park transform module 108. For example, the estimation module 107 determines the vector control frequency as $$f_{CTRL} = \frac{\omega_e}{2\pi} \frac{180}{\Delta\theta},$$

$\Delta\theta$ position error resulting of the system latency in presence of speed. At that step, the estimation module 107 determines the control interval $T_{CTRL}$ as the inverse of the vector control frequency $f_{CTRL}$.

At step S12, the estimation module 107 determines the injection pattern frequency from the estimated speed. For example, the estimation module 107 determines the injection pattern frequency as $f_{inject} = f_{CTRL}/P$ where P is the ratio between vector control frequency $f_{CTRL}$ and an unaudible low frequency, e.g. 100 Hz.

At low speeds, this enables to reduce the injection frequency, and thus reduces audible noise generated by the injected pattern. In addition, HF iron losses are reduced. The accuracy of position in presence of speed is constant.

At step S13, the estimation module 107 determines an injection voltage level $V_o$ from the estimated inductances and an injection frequency $f_{inject}$.

This enables to keep current variations resulting from HF injection to some stabilised level, regardless of saturation conditions, and change of injection frequency. The current variations can be optimised to fight for measurement noise floor, while minimising HF iron losses.

As example, $V_o = L \cdot \Delta I f_{inject}$, where $\Delta I$ is a target level of current variations due to injection and L is an inductance estimated at step S63 or step S83. As example, L is the smallest inductance among $L_d'$ and $L_q'$.

At next step S14, the estimation module 107 determines the duration of subperiods of injection pattern. The duration of subperiods is a multiple K of half switching periods ($\frac{1}{2}f_{sw}$). For example, the estimation module 107 determines $K=2f_{sw}/Nf_{inject}$, where N is the size of polygonal voltage pattern, for example three in the example of FIG. 2.

FIGS. 15-18 represent in plain line the time variations of the reference voltage $V_a^{**}$ of one phase according to various embodiments of the invention.

Only one phase is represented for the sake of clarity, but the embodiments equally apply to the other phases.

In each FIG. 11a, 11b, 11c, 11d, the voltage pattern has duration $T_{pattern}$, which is the sum of subperiods, and a size equal to the offset voltage $V_o$. The duration of voltage pattern is always smaller than the control interval $T_{CTRL}$, the time interval between consecutive updates of control voltage vector according to the invention, and the voltage pattern is superposed to the control voltage vector $V_a^*$, which is represented in dashed line.

Figure 15:
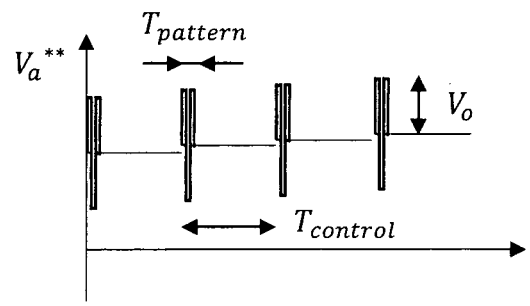
FIG. 15 represents the rotational speed of the motor is very low, and the control interval $T_{CTRL}$ between two consecutive voltage patterns is large.

In FIG. 15, the rotational speed of the motor is very low, and the control interval $T_{CTRL}$ between two consecutive voltage patterns is large. The number of minor flux loops resulting from the invention is small, resulting in limited iron losses in the magnetic core of the machine.

Figure 16:
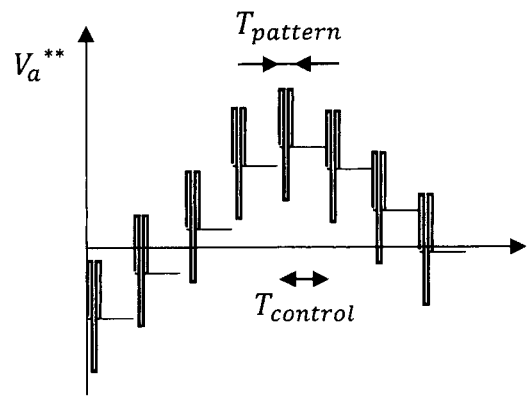
FIG. 16 represents the rotational speed of the motor is high, and the estimation module reduces the time interval $T_{CTRL}$.

In FIG. 16, the rotational speed of the motor is high, and the estimation module 107 reduces at step S11 the time interval $T_{CTRL}$. The controllability of the motor is increased compared with FIG. 15, the rotor position can be determined at high speed.

Figure 17:
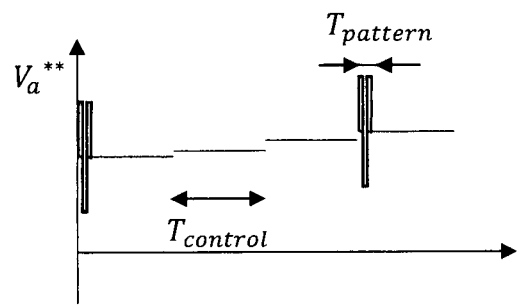
FIG. 17 represents the rotational speed of the motor is very low, with a large control interval $T_{CTRL}$.

In FIG. 17, the rotational speed of the motor is very low, with a large control interval $T_{CTRL}$, identical to the one in FIG. 15. The estimation module 107 increases the duration of voltage pattern according to step S12, and also reduces the offset voltage $V_o$. The number and size of minor flux loops is identical to the one of FIG. 15.

Compared with FIG. 15, the injection frequency is smaller. As a result, the audible noise generated by the voltage pattern is shifted to low frequencies, and produces less burden to human ears. Furthermore, the current response is less prone to high frequency effects (e.g., eddy currents, excess loss), and level of HF iron losses resulting from voltage injection is reduced.

Figure 18:
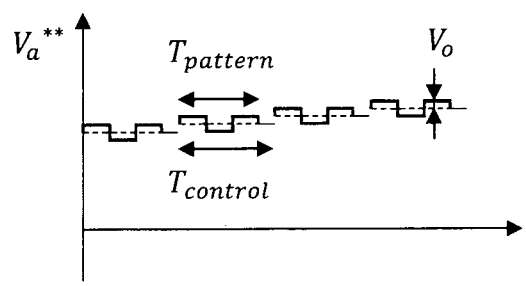
FIG. 18 represents the rotational speed of the motor is very low, with a large control interval $T_{CTRL}$.

In FIG. 18, the rotational speed of the motor is very low, with a large control interval $T_{CTRL}$, identical to that in FIG. 15. In this example, the voltage pattern is injected only once every K=3 control intervals. At control intervals including injection, the estimation module 107 estimates rotor position as in step S63, and also estimates the speed of the motor from estimated rotor position. At control intervals without injection, the estimation module 107 extrapolates the rotor position according to last estimated rotor position, last estimated rotor speed, and $T_{CTRL}$ determined at step S11. Estimation module 107 serialises the estimated and extrapolated position towards modules 101 and 108, so that current controller keeps fast operation in spite of absence of injection patterns.

As example, the rotor position Theta at time t is extrapolated from last known rotor position and rotor speed at time $t_{last}$ from Theta(t)=Theta($t_{last}$)+Speed*(t−$t_{last}$). The speed is estimated at control intervals including injection as Speed= (Theta($t_{inj,n}$)−Theta($t_{inj,n-1}$))/($t_{inj,n}$−$t_{inj,n-1}$), where Theta($t_{inj,n}$) is the rotor position estimated according to the invention at steps S63 or S82.

The invention claimed is:

1. A method for determining a position of a rotor of a three-phase motor using a field oriented control system, characterized in that the method comprises the steps of:
   determining, by a proportional-integral controller, a first control voltage vector at a first instant, using Park transformed motor currents and reference currents,
   transforming the first control voltage vector using an inverse Park transform,
   summing the transformed first control voltage vector to a regular polygonal voltage pattern, the regular polygonal voltage pattern being applied during a given duration, the regular polygonal voltage pattern being composed of at least three subperiods,
   performing a pulse-width modulation from the sum of the transformed first control voltage vector and the regular polygonal voltage pattern, wherein the pulse-width modulation is further performed from a carrier signal,
   controlling the motor with the pulse-width modulation,
   measuring a current at each phase of the motor,
   estimating a position of the rotor from the measured currents and from the regular polygonal voltage pattern, the regular polygonal voltage pattern being composed of plural consecutive subperiods, each subperiod being equal to an integer number times half a period of the carrier signal, and starting at one extremum of the carrier signal,
   determining, at a second instant, a second control voltage vector from the measured currents and from the estimated position, the time between first and second instants being upper than or equal to the given duration.

2. The method according to claim 1, characterized in that the motor is controlled by the pulse-width modulation through an inverter and the currents are measured at the extremums of the carrier signal.

3. The method according to claim 2, characterized in that the position of the rotor is estimated from a polygonal current response, which is built from a number of current measurements, equal to the number of subperiods plus one, and the difference between the first and last current measurements is used to modify the other current measurement in order to obtain a polygonal current response.

4. The method according to claim 3, characterized in that the estimation of the position of the rotor from the measured currents and from the regular polygonal voltage pattern is performed using a number of coefficients that is equal to the number of subperiods and the coefficients are determined from the polygonal current response.

5. The method according to claim 3, characterized in that the estimation of the position of the rotor from the measured currents and from the regular polygonal voltage pattern is performed from the polygonal current response that forms a constellation of points using a minimum mean square error method, in order to find a straight line passing through a gravity center of constellation of points with an angle with q axis and having a minimal distance with the set of points in the constellation, the angle being the position of the rotor.

6. The method according to claim 3, characterized in that the method comprises further steps of:
   estimating a first rotational speed of the rotor from the first estimated position of the rotor,
   determining a periodicity of the control voltage vector from the first estimated rotational speed,
   determining a periodicity of the regular polygonal voltage pattern from the periodicity of the control voltage vector.

7. The method according to claim 3, characterized in that the method further comprises the steps of:

estimating inductance values of the motor from the measured currents and from the regular polygonal voltage pattern, determining a value of a voltage that is used to generate the regular polygonal voltage pattern from the estimated inductance values.

8. The method according to claim 6, characterized in that the method further comprises the step of:

transforming the second control voltage vector using an inverse Park transform, performing a pulse-width modulation from the transformed second control voltage vector, controlling the motor with the pulse-width modulation from the transformed second control voltage vector, measuring the current at each phase of the motor, estimating a second rotor position of the rotor according to the first estimated rotor position, first estimated rotor speed, and the periodicity of the control voltage vector, determining a third control voltage pattern from the measured currents and from the estimated second rotor position.

9. The method according to claim 1, characterized in that one regular polygonal voltage pattern is summed for each phase and the regular polygonal voltage pattern is inverted or permuted at each determination of a control voltage vector.

10. The method according to claim 6, characterized in that the method further comprises the step of memorizing estimated inductance values.

11. A device for determining a position of a rotor of a three-phase motor using a field-oriented control system, characterized in that the device comprises:

processing circuitry configured to perform determining, by a proportional-integral controller, a first control voltage vector at a first instant using Park transformed motor currents and reference currents, transforming the first control voltage vector using an inverse Park transform, summing the transformed first control voltage vector to a regular polygonal voltage pattern, the regular polygonal voltage pattern being applied during a given duration, the regular polygonal voltage pattern being composed of at least three subperiods, performing a pulse-width modulation from the sum of the transformed first control voltage vector and the regular polygonal voltage pattern, wherein the pulse-width modulation is further performed from a carrier signal, controlling the motor with the pulse-width modulation, measuring a current at each phase of the motor, estimating a position of the rotor from the measured currents and from the regular polygonal voltage pattern, the regular polygonal voltage pattern being composed of plural consecutive subperiods, each subperiod being equal to an integer number times half a period of the carrier signal, and starting at one extremum of the carrier signal, and determining, at a second instant, a second control voltage vector from the measured currents and from the estimated position, the time between first and second instants being upper than or equal to the given duration.

* * * * *